(12) United States Patent
Han

(10) Patent No.: US 9,105,605 B2
(45) Date of Patent: Aug. 11, 2015

(54) SEMICONDUCTOR DEVICE

(71) Applicant: MagnaChip Semiconductor, Ltd., Cheongju-si (KR)

(72) Inventor: Jin Woo Han, Bucheon-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/254,047

(22) Filed: Apr. 16, 2014

(65) Prior Publication Data

US 2015/0115357 A1    Apr. 30, 2015

(30) Foreign Application Priority Data

Oct. 28, 2013    (KR) .................. 10-2013-0128707

(51) Int. Cl.
| | |
|---|---|
| *H01L 29/76* | (2006.01) |
| *H01L 29/423* | (2006.01) |
| *H01L 27/088* | (2006.01) |
| *H01L 27/02* | (2006.01) |

(52) U.S. Cl.
CPC ........ *H01L 29/4236* (2013.01); *H01L 27/0203* (2013.01); *H01L 27/088* (2013.01)

(58) Field of Classification Search
CPC .............. H01L 29/4236; H01L 27/088; H01L 27/0203
See application file for complete search history.

(56) References Cited

U.S. PATENT DOCUMENTS

| | | | |
|---|---|---|---|
| 6,891,223 B2 | 5/2005 | Krumrey et al. | |
| 7,859,047 B2 * | 12/2010 | Kraft et al. | ..... 257/330 |

\* cited by examiner

*Primary Examiner* — Long Pham
(74) *Attorney, Agent, or Firm* — NSIP Law

(57) ABSTRACT

There is provided a semiconductor device. The semiconductor device includes a plurality of trench transistors in an active region, and an interconnection disposed in an edge region, the interconnection configured to transfer a voltage to the plurality of trench transistors, in which the edge region comprises a substrate, a first insulating layer, a first electrode, a second insulating layer, and a second electrode, disposed in that order.

16 Claims, 3 Drawing Sheets

SEMICONDUCTOR DEVICE

CROSS-REFERENCE TO RELATED APPLICATIONS

This application claims the benefit under 35 USC 119(a) of Korean Patent Application No. 10-2013-0128707 filed on Oct. 28, 2013, in the Korean Intellectual Property Office, the entire disclosure of which is incorporated herein by reference for all purposes.

BACKGROUND

1. Field

The following description relates to a semiconductor device, and to a semiconductor device configured to reduce gate-drain capacitance (Cgd), in an edge region in which an interconnection is formed to transfer a voltage to a plurality of trench transistors that are formed in an active region, by further forming a shield electrode that is connected with a source power, at or below a portion of a gate electrode of the edge region.

2. Description of Related Art

Channels of metal-oxide-semiconductor (MOS) transistors are mainly used to implement high voltage semiconductor devices. In such high voltage semiconductor devices, double diffused metal-oxide-semiconductor field-effect (DMOS) transistors are formed horizontal to a surface of substrate. However, due to recent reduction of a design rule of a semiconductor device, trench MOS transistors may be used to implement high voltage semiconductor devices. Such high voltage MOS transistors having vertical channels that are easily integrated to a high degree. In the trench MOS transistor, a drain is arranged at a bottom side (or a back side) of a substrate, and a source is arranged on an upper side (or a front side) of a substrate. A gate is arranged inside trench that is dented into the substrate surface, and the current flows along a side wall of the trench, up and down in the substrate.

In such a semiconductor device, a gate structure configured to deliver a voltage to the gate is formed on the entire surface of the semiconductor chip. Thus, capacitance is generated between the gate structure and drain on the bottom surface of the substrate. Due to the capacitance that is generated between the gate structure and the drain, reverse capacitance increases, which in turn reduces the switching ability of the entire device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device including a plurality of trench transistors in an active region, and an interconnection disposed in an edge region, in which the interconnection is configured to transfer a voltage to the plurality of trench transistors; and the edge region includes a substrate, a first insulating layer, a first electrode, a second insulating layer, and a second electrode, disposed in that order.

The trench transistors in the active region may have a multilayered structure in which a first insulating layer, a first electrode, a second insulating layer, and a second electrode are disposed in that order inside a trench.

The first electrode may be a shield electrode that is electrically connected with a source power. The second electrode may be a gate electrode that is electrically connected with a gate power.

The edge region further includes a first contact electrically connected with the first electrode, and a second contact electrically connected with the second electrode.

A width of the first electrode may be wider than a width of the second electrode, in the edge region.

The edge region may further include a LOCOS (local oxidation of silicon) layer disposed between the substrate and the first electrode.

A width of the LOCOS layer may be wider than a width of the first electrode.

The first contact and the second contact may be disposed on an upper side of the substrate.

The first electrode and the second electrode may be polysilicon.

In another general aspect, a semiconductor device includes an active region comprising a plurality of trench transistors, an edge region surrounding the active region, and a first electrode, an insulating layer, a second electrode, and a first interconnection disposed in that order in the active region. The first electrode may be a shield electrode that is electrically connected with a source power, and the second electrode is a gate electrode that is electrically connected with a gate power.

The first electrode and the first interconnection may extend to the edge region such that the first electrode electrically connects with the interconnection in the edge region.

The semiconductor device may further include a second interconnection in the edge region, and the second interconnection may extend to the edge region such that the second interconnection electrically connects with the second electrode in the edge region.

The trench transistors in the active region may have a multilayered structure in which a first insulating layer, a first electrode, a second insulating layer, and a second electrode are disposed in that order inside a trench.

The first electrode and the second electrode may be polysilicon.

A width of the first electrode may be wider than a width of the second electrode, in the edge region.

The edge region may further include a LOCOS layer disposed between the substrate and the first electrode.

A width of the LOCOS layer may be wider than a width of the first electrode.

The first contact and the second contact may be disposed on an upper side of the substrate.

Other features and aspects will be apparent from the following detailed description, the drawings, and the claims.

Figure 1:
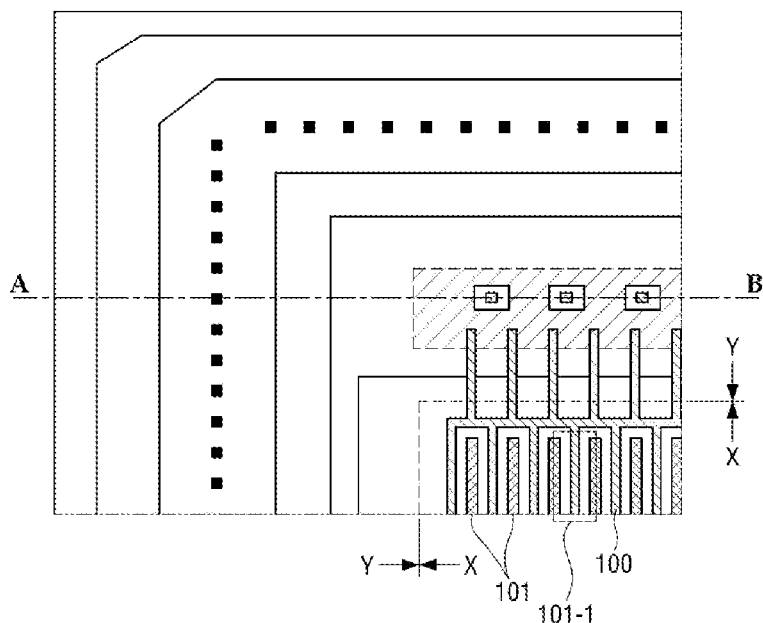
FIG. 1 illustrates a plan view of an example of a semiconductor device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that, although the terms first, second, A, B, etc. may be used herein in reference to elements of the disclosure, such elements should not be construed as limited by these terms. For example, a first element could be termed a second element, and a second element could be termed a first element, without departing from the scope of the present disclosure. Herein, the term "and/or" includes any and all combinations of one or more referents.

The terminology used herein is for the purpose of describing embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concept will be described with reference to the accompanying drawings.

In a high voltage semiconductor device implemented with trench MOS transistors having vertical channels, a gate structure configured to deliver a voltage to the gate is formed on the entire surface of the semiconductor chip. Thus, capacitance is generated between the gate structure and drain on the bottom surface of the substrate. Due to the capacitance that is generated between the gate structure and the drain, reverse capacitance increases, which in turn reduces the switching ability of the entire device.

Described below is an example of a semiconductor device configured to reduce reverse capacitance that is generated in the edge region of the semiconductor device.

In one example, the semiconductor device is configured to reduce capacitance between gate-drain, and thereby, AC characteristic of the device can be improved.

Figure 2:
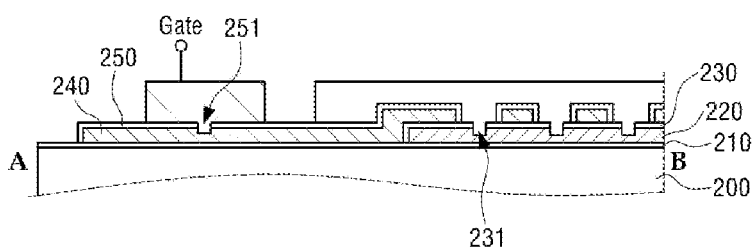
FIG. 2 illustrates a cross-sectional view of the semiconductor device illustrated in FIG. 1.

FIG. 1 illustrates a plan view of an active region and an edge region according to a conventional semiconductor device. FIG. 2 illustrates a cross-sectional view taken along line A-B in FIG. 1.

Referring to FIG. 1, a semiconductor is divided into an active region (X) and an edge region (Y). The active region (X) comprises a trench 100, a trench transistor cell 101-1 and contacts 101, and the contacts 101 are positioned inside the active region. The edge region (Y) comprises an interconnection configured to transfer a voltage to an electrode.

Referring to FIG. 2, a first insulating layer 210 is formed on a substrate 200. A shield structure 220 is formed on the first insulating layer 210. A second insulating layer 230, a gate structure 240, and a third insulating layer 250 are formed on the upper surface of the substrate. The contact holes 231, 251 are formed at the second insulating layer 230 and the third insulating layer 250. In the semiconductor device as illustrated in FIG. 2, capacitance is generated between the gate structure and the drain on the bottom surface of the substrate.

Figure 3:
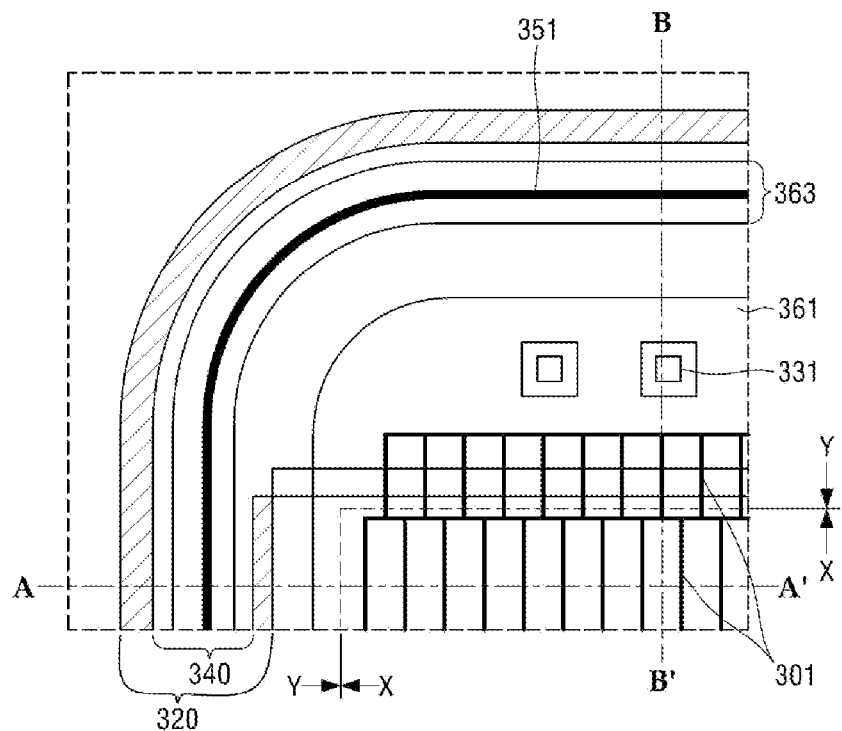
FIG. 3 illustrates a plan view of a portion of an example of a semiconductor device.
Figure 4:
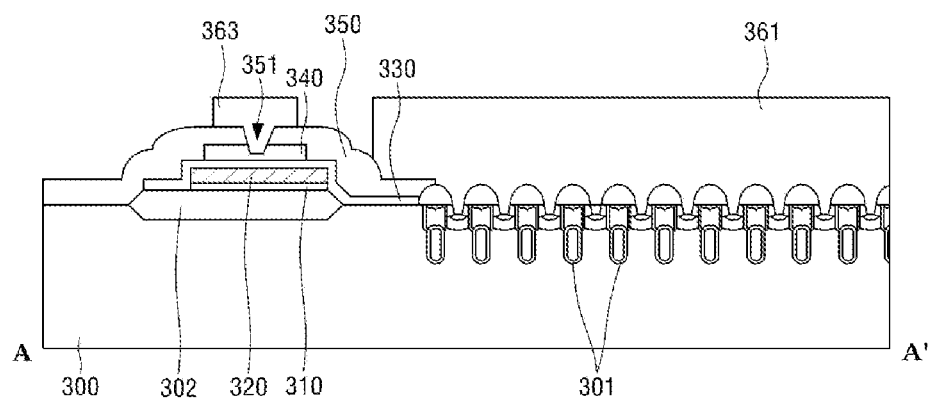
FIG. 4 illustrates a cross-sectional view of the semiconductor device of FIG. 3 along line A-A'.
Figure 5:
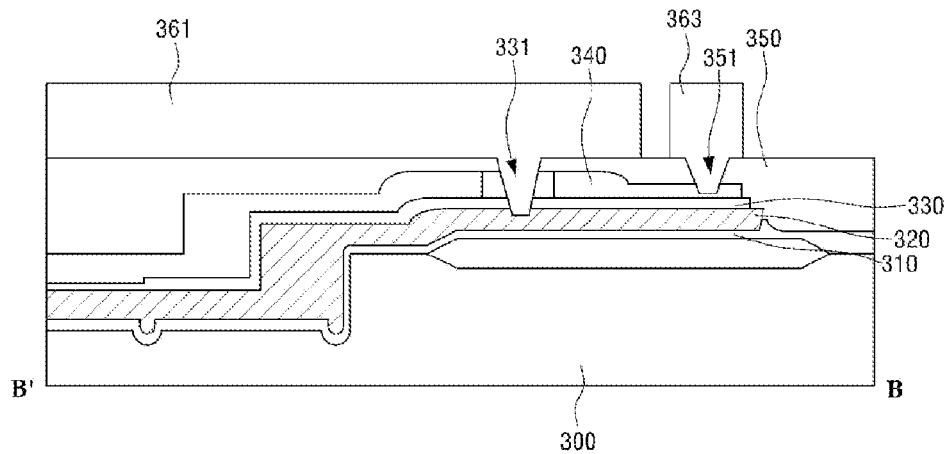
FIG. 5 illustrates a cross-sectional view of the semiconductor device of FIG. 3 along line B-B'.

FIG. 3 illustrates a plan view of an example of a semiconductor device according to the present disclosure. FIG. 4 illustrates a cross-sectional view of the semiconductor device along line A-A' of FIG. 3. FIG. 5 illustrates a cross-sectional view of a semiconductor device along line B-B' of FIG. 3.

As illustrated in FIGS. 3 to 5, an example of a semiconductor device according to the present disclosure comprises an active region (X) and an edge region (Y). The active region (X) includes a plurality of trench transistors, and an interconnection is formed to transfer a voltage to the plurality of trench transistors in the edge region (Y). The edge region (Y) has a multilayered structure, in which a substrate 300, a first insulating layer 310, a first electrode 320, a second insulating layer 330, and a second electrode 340 are disposed on top of each other.

A substrate 300 could be a wafer or a glass substrate. In one example, one side of the substrate is formed to have a predetermined thickness though an additional grinding or chemical mechanical polishing (CMP) process. For example, a bottom surface of the substrate 300 may be grinded or CMP process may be applied to the surface for the substrate, in order for the substrate to have a predetermined thickness. The substrate 300 being thick may be referred to a buffer layer. The substrate 300 consists of an active region (X) in which a semiconductor device is formed as a trench transistor cell, and an edge region (Y) in which contacts (i.e., interconnections) configured to transfer a voltage to a semiconductor device are formed.

According to one example, trenches 301 are formed in the active region (X) and the edge region (Y) in the substrate 300.

Hereinafter, a semiconductor device according to one example will be described in detail, in priority of the edge region (Y).

According to an example to the present disclosure, the edge region (Y) is laminated with: a substrate 300; a first insulating layer 310 formed on the substrate 300; a first electrode 320 formed on the first insulating layer 310; a second insulating layer 330 formed on the first electrode 320 and the substrate 300; and a second electrode 340 formed on the second insulating layer 330. The edge region (Y) may further comprise a first contact being electrically connected with the first electrode 320; and a second contact that is electrically connected with the second electrode 340.

The first insulating layer 310 is formed on the substrate 300. That is, the first insulating layer 310 is formed on the entire surface of the substrate 300. Additionally, the first insulating layer 310 may be formed on a substrate surface on the side of the substrate that includes the bottom surfaces and side walls of the trenches 301 that are formed in the active region (X) and the edge region (Y) in the substrate 300.

The first electrode 320 is formed on the first insulating layer 310. The first electrode 320 may be formed in both the active region (X) and the edge region (Y) on the substrate 300 that is formed of the first insulating layer 310. In one example, the first electrode 320 is formed inside the trenches, as well as the substrate 300 surface. Regarding the first electrode 320, its thickness, its shape, and a region where the first electrode 320 is formed can be modified, to satisfy the desired characteristics of the semiconductor device.

In an example according to the present disclosure, a trench transistor formed in the active region (X) of the semiconductor device could be a trench MOS transistor having two electrodes inside trenches 301. The first electrode 320 is arranged in a bottom region of the trench 301, and it could be referred to a shield electrode or a field electrode. Such shield electrode can be configured to change an electric field structure inside a semiconductor device, according to voltages transferred to the shield electrode.

Subsequently, the second insulating layer 330 is formed on the first electrode 320 and the substrate 300. The second insulating layer 330 may be formed of the same material as the first insulating layer 310. The second insulating layer 330 electrically insulates the first electrode 320 and the second electrode 340.

Referring to FIG. 5, the second insulating layer 330 may include a first contact hole 331 that electrically connects the first electrode 320 (or a shield electrode) with a first interconnection 361. The second insulating layer 330 exposes the first electrode to outside in an edge region (Y), in a cross-sectional view taken along line B-B' of the semiconductor device. According to the example of the present disclosure, the first contact hole 331 may be referred to a first contact; however, it may further include a first interconnection 361 that contacts a first electrode 320 (or a shield electrode) through a first contact hole 331. The first interconnection comprises first contact and metal layer. The first contact hole is filled with tungsten (W) metal and Titanium Nitride (TiN) layer. Metal layer above the first contact comprises Copper (Cu) metal or Aluminum (Al) metal or combined metal of Al and Cu.

The second electrode 340 is formed on the second insulating layer 330. That is, the second electrode 340 is formed at a surface of the substrate 300 formed of the second insulating layer 330, or at upper sides of the trenches 301.

Subsequently, a third insulating layer 350 is formed on the second electrode 340. The third insulating layer 350 includes a second contact hole 351 to connect the second interconnection 363 and the second electrode 340 in the edge region (Y). According to the example of the present disclosure, the second contact hole 351 may be referred to a second contact. Similar to the first interconnection, the second interconnection comprises the second contact and metal layer. The second contact hole is filled with tungsten (W) metal and Titanium Nitride (TiN) layer. Metal layer above the second contact hole comprises Copper (Cu) metal or Aluminum (Al) metal or combined metal of Al and Cu. The second contact hole 351 can be formed simultaneously with the formation of the first contact hole 331 on the second insulating layer 330 that is exposed to outside, in the edge region (Y); and it may be formed through an additional process. In this regard, in the example of the present disclosure, a method of forming a contact hole is not specifically limited. Nevertheless, in one example, the contact hole is formed to be open lined, in order to reduce a resistance according to an increase of a contact region between each electrode and an interconnection.

A first interconnection 361 and a second interconnection 363 are formed on the second insulating layer 330 and the third insulating layer 350 in the active region (X) and the edge region (Y), in order to electrically connect a bottom electrode, through a first contact hole 331 and a second contact hole 351. The interconnections comprise contact plug and metal layer. Contact plug is filled into the contact hole formed by etching the insulating layer. Metal layer is also connected to the contact plug. Tungsten (W) layer or Titanium Nitride (TiN) layer may be used as contact plug. Copper (Cu) metal or Aluminum (Al) metal or combined metal of Al and Cu may be used as metal layer.

A source electrode in the active region (X) can be formed simultaneously with the formations of the first interconnection 361 and the second interconnection 363. In one example, the first interconnection 361, the second interconnection 363 and the source electrode are formed of conductive metal material. Further, the first interconnection 361 and the second interconnection 363 in the edge region (Y) can be used as a voltage receiver. The first interconnection 361 can be electrically connected with the source electrode.

That is, in an example to the present disclosure, the first electrode 320 is a shield electrode that is electrically connected with a source power. The second electrode 340 is a gate electrode that is electrically connected with a gate power.

As illustrated in FIG. 4, in an example according to the present disclosure, the first electrode 320 can be formed to be wider than a width of the second electrode 340. For example, in a cross-sectional view of the edge region (Y) taken along line A-A' of the semiconductor device, a width of the first electrode 320 that is laminated on the substrate 300 surface can be wider than that of the second electrode 340. Due to the width, the reverse capacitance that is generated between the second electrode 340 and the substrate 300 (between gate-drain) can be suppressed.

In another example according to the present disclosure, the LOCOS layer 302 may be additionally formed between the substrate 300 and the first electrode 320 in the edge region (Y).

The LOCOS layer 302 can be wider than a width of the first electrode 320.

The LOCOS layer 302 as above is configured to be a device isolation. The device isolation can effectively suppress reverse capacitance that is generated between the second electrode 340 and the substrate 300.

In a semiconductor having the described structure, gate-drain capacitance (Cgd) that is usually generated between a gate poly or an electrode and a drain at a bottom substrate 300 can be converted to gate-source capacitance (Cgs) and source-drain capacitance (Cds), due to a first electrode 320 that is electrically connected with a source voltage. Accordingly, an AC operation can be enhanced generally in the semiconductor device.

In the present disclosure, a trench transistor formed in the active region (X) can be formed as a multilayered structure in which a first insulating layer 310, a first electrode 320, a second insulating layer 330 and a second electrode 340 are laminated in regular sequence inside the trenches 301. According to a semiconductor device of the present disclosure, a trench transistor in the active region (X) can have a multilayered structure. In the multilayered active region (X), a first insulating layer 310 may be formed at a bottom portion and a side wall of the trench 301, and a first electrode 320 may be arranged at a bottom portion of the trench 301. In addition, a second insulating layer 330 may be on the first electrode 320, and a second electrode 340 may be arranged at an upper portion of the trench 301.

Firstly, a trench 301 is formed on the substrate 300. Additional trench process may be performed to form the trench 301.

Subsequently, a first electrode 320 and a second electrode 340 are formed at a bottom portion and an upper portion of the trench 301 respectively. Thus, according to one example of the present disclosure, a trench MOS transistor having two electrodes can be used as the trench transistor formed in the active region (X).

A first insulating layer 310 may be formed to electrically insulate the substrate 300 and the first electrode 320, and a second insulating layer 330 may be formed to electrically insulate the first electrode 320 and the second electrode 340.

The first insulating layer 310, the first electrode 320, the second insulating layer 330 and the second electrode 340, which are laminated inside the trench 301, can be formed simultaneously with the formations of the first insulating layer 310, the first electrode 320, the second insulating layer 330 and the second electrode 340 in the edge region (Y), respectively.

Figure 6:
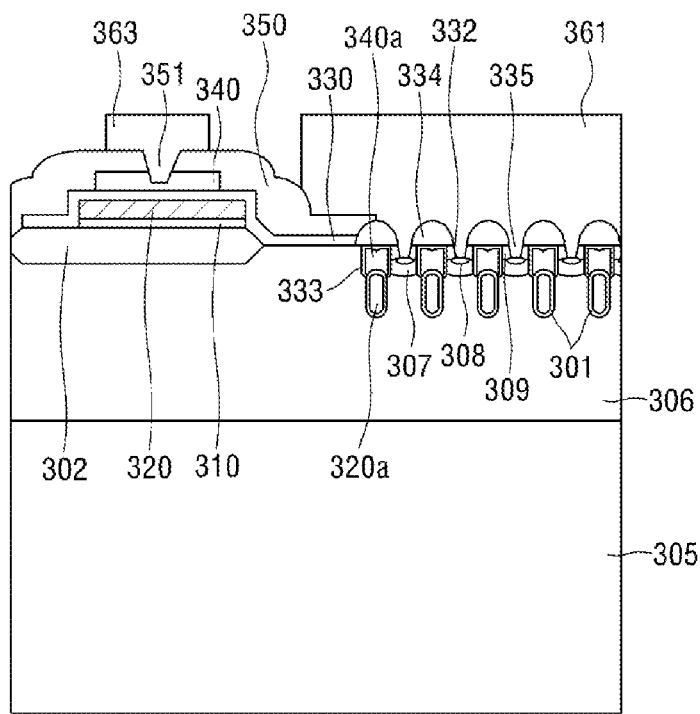
FIG. 6 illustrates a cross-sectional magnifying view of semiconductor device of FIG. 4.

As illustrated in FIG. 6, in one example of the semiconductor device according to the present disclosure, a low concentration N-type drift region 306 is disposed on the substrate 305 having doped layers of a high concentration N++. The low concentration N-type drift region 306 is formed on the substrate using epitaxial growth method. Furthermore, the trench 301 is formed in the N-type drift region 306 using a trench mask, and a split Poly-Si gate is then formed in which a bottom ploy-si, a gate oxide, a top poly-Si are disposed in that order. A detailed manufacturing process thereof is as follows. First, the poly-Si layer is filled in the trench 301 and then followed etch-back process to remain the poly-Si in the bottom of the trench. During the etch-back process, etch rate of the poly-Si is more fast in the center portion than the edge portion such that a key hole is formed at center portion. The key hole causes the device characteristics to be degraded. Therefore, a flat surface at the center portion on the top surface of the poly-Si layer is required to obtain good device qualities. The center portion can be substantially planar surface through a thermal oxidation process which removes the key hole. Then, a bottom poly-Si 320a is formed in the bottom of the trench 301 having a substantially co-planar top surface. Thereafter, a gate insulator 333 is formed on the exposed sidewalls of the trench 301 as well as top surface of the bottom poly-Si by thermal oxidation. A poly-Si layer is again deposited and then followed by etch-back process to form a second gate electrode 340a. In the present disclosure, a Split Poly-Si Gate is formed through the above-described process.

A P-type body region 307 is then formed by ion-implanting P-type dopant in an N-type drift region 306 using a body mask (not shown). Then, a high concentration N+ source region 309 is formed using N+ mask (not shown). An ILD layer 334, for example a BPSG layer, is then deposited on the N+ source region 309 and P-type body region 307. Thereafter, a contact hole 332 is formed by selectively etching an ILD layer 334 and a portion of N-type drift region 306 using a contact mask (not shown). The contact hole exposes both N+ source region 309 and P-type body region 307. Thereafter, by P+ ion-implanting to a bottom of the contact hole 332, a P+ contact region 308 is formed in the P-type body region 307. The P+ contact region 308 has higher concentration than the P-type body region 307. Then, tungsten (W) contact plug 335 is formed in the contact hole and followed by deposition of metal layers 361, such as Al or Cu metal or combined Cu—Al on the contact plug.

The concentration of dopant in a high concentration $N^{++}$ substrate 305 is greater than the concentration of dopant in a low concentration $N^{-}$ drift region 306, and the concentration of dopant in a high concentration $P^{+}$ contact region 308 is greater than the concentration of dopant in a P-type body reign 307. In this regard, in one example according to the present disclosure, a method of forming a doped layer of the device is not limited. Such doped layers are formed according as an impurity selectively dopes/spreads thereto.

Additionally, according to one example of the present disclosure, the semiconductor device may comprise a drain electrode formed at a bottom surface of the substrate 300 having a certain thickness after passing through the CMP process toward a bottom surface of a wafer. The drain electrode can be formed of an identical material to any electrode. The drain electrode is implanted in a P-type between the electrode and the substrate 300, and then, a baking process is performed therein. Accordingly, an implantation layer can be further included, which is used as a P-type collector.

In the example of the semiconductor device described above, the general AC characteristic of the semiconductor device may be enhanced by converting gate-drain capacitance (Cgd) generated between a drain in the substrate 300 and the gate poly that is used as a second electrode 340, to gate-source capacitance (Cgs) and source-drain capacitance (Cds).

According to one example of the semiconductor device, there is an effect that the reverse capacitance generated between gate and drain is suppressed by inserting a shield electrode having a source power at a bottom portion of a gate interconnection that is formed in the edge region.

For example, by inserting a shield electrode having a source power between a gate electrode connected with the gate interconnection and a substrate, gate-drain capacitance (Cds) is converted to gate-source capacitance (Cgs) and source-drain capacitance (Cds); thus, overall AC operation can be improved.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a plurality of trench transistors in an active region; and
an interconnection disposed in an edge region,
wherein the interconnection is configured to transfer a voltage to the plurality of trench transistors;
the edge region comprises a substrate, a first insulating layer, a first electrode, a second insulating layer, and a second electrode, disposed in that order; and
the edge region further comprises a LOCOS layer disposed between the substrate and the first electrode.

2. The semiconductor device according to claim 1,
wherein the trench transistors in the active region have a multilayered structure in which a first insulating layer, a first electrode, a second insulating layer, and a second electrode are disposed in that order inside a trench.

3. The semiconductor device according to claim 1,
wherein the first electrode is a shield electrode that is electrically connected with a source power, and
wherein the second electrode is a gate electrode that is electrically connected with a gate power.

4. A semiconductor device, comprising:
a plurality of trench transistors in an active region; and
an interconnection disposed in an edge region,
wherein the interconnection is configured to transfer a voltage to the plurality of trench transistors;
the edge region comprises a substrate, a first insulating layer, a first electrode, a second insulating layer, and a second electrode, disposed in that order; and
the edge region further comprises:
a first contact electrically connected with the first electrode; and
a second contact electrically connected with the second electrode.

5. The semiconductor device according to claim 1,
wherein a width of the first electrode is wider than a width of the second electrode, in the edge region.

6. The semiconductor device according to claim 1,
wherein a width of the LOCOS layer is wider than a width of the first electrode.

7. The semiconductor device according to claim 3,
wherein the first contact and the second contact are disposed above the substrate.

8. The semiconductor device according to claim 1,
wherein the first electrode and the second electrode are polysilicon.

9. A semiconductor device, comprising:
an active region comprising a plurality of trench transistors;
an edge region surrounding the active region; and
a first electrode, an insulating layer, a second electrode, and a first interconnection disposed in that order in the active region,
wherein the first electrode is a shield electrode that is electrically connected with a source power; the second electrode is a gate electrode that is electrically connected with a gate power; and the first electrode and the first interconnection extent to the edge region such that the first electrode electrically connects with the first interconnection in the edge region.

10. The semiconductor device according to claim 9, further comprising a second interconnection in the edge region,
wherein the second interconnection extends to the edge region such that the second interconnection electrically connects with the second electrode in the edge region.

11. The semiconductor device according to claim 9,
wherein the trench transistors in the active region have a multilayered structure in which a first insulating layer, a first electrode, a second insulating layer, and a second electrode are disposed in that order inside a trench.

12. The semiconductor device according to claim 9,
wherein the first electrode and the second electrode are polysilicon.

13. The semiconductor device according to claim 9,
wherein a width of the first electrode is wider than a width of the second electrode, in the edge region.

14. The semiconductor device according to claim 9,
wherein the edge region further comprises a LOCOS layer below the first electrode.

15. The semiconductor device according to claim 14,
wherein a width of the LOCOS layer is wider than a width of the first electrode.

16. The semiconductor device according to claim 9,
wherein a substrate is disposed below the first electrode in the edge region;
the first electrode connects to the first interconnection via a first contact;
the second electrode connects to the second interconnection via a second contact; and
the first contact and the second contact are disposed above the substrate.

* * * * *